(12) United States Patent
Gao

(10) Patent No.: US 12,089,370 B2
(45) Date of Patent: Sep. 10, 2024

(54) THERMAL MANAGEMENT DEVICE FOR HIGH DENSITY PROCESSING UNIT

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 127 days.

(21) Appl. No.: 17/700,764

(22) Filed: Mar. 22, 2022

(65) Prior Publication Data

US 2023/0320034 A1 Oct. 5, 2023

(51) Int. Cl.
*H05K 7/20* (2006.01)
*G06F 1/20* (2006.01)

(52) U.S. Cl.
CPC ......... *H05K 7/20327* (2013.01); *G06F 1/206* (2013.01); *H05K 7/20318* (2013.01); *G06F 2200/201* (2013.01)

(58) Field of Classification Search
CPC .......... H05K 7/20263; H05K 7/20254; H05K 7/20327; H05K 7/20318; G06F 1/20; G06F 1/206; G06F 2200/201
USPC ............................. 361/679.47, 679.53, 710
See application file for complete search history.

(56) References Cited

U.S. PATENT DOCUMENTS

| | | | | | |
|---|---|---|---|---|---|
| 5,305,184 | A * | 4/1994 | Andresen | ........... | H05K 7/20872 361/720 |
| 6,130,818 | A * | 10/2000 | Severson | ........... | H05K 7/20163 361/818 |
| 6,357,514 | B1 * | 3/2002 | Sasaki | ................. | H01L 23/3672 165/185 |
| 6,639,799 | B2 * | 10/2003 | Prasher | ................. | H01L 23/427 165/80.4 |
| 6,708,515 | B2 * | 3/2004 | Malone | ............... | H01L 23/4336 257/E23.093 |
| 6,889,756 | B1 * | 5/2005 | Hou | ...................... | H01L 23/427 174/15.2 |
| 7,011,146 | B2 * | 3/2006 | Wong | .................... | F28D 15/043 165/104.33 |
| 7,082,778 | B2 * | 8/2006 | Patel | ................... | H01L 23/4336 62/118 |
| 7,284,389 | B2 * | 10/2007 | Sharma | ............... | H01L 23/4735 257/E23.1 |
| 7,382,620 | B2 * | 6/2008 | Khanna | ................... | H01L 23/42 361/708 |

(Continued)

*Primary Examiner* — Anatoly Vortman
(74) *Attorney, Agent, or Firm* — WOMBLE BOND DICKINSON (US) LLP

(57) ABSTRACT

A cooling device for cooling a chip and a cooling system using the cooling device are disclosed. The cooling device includes a cooling layer, an internal channel, and a vapor layer. The cooling layer is divided into multiple cooling regions for cooling different regions of the chip. The internal connection is divided into multiple sections corresponding to the multiple cooling regions. Two-phase coolant entering the cooling layer is converted to mixed fluid, which is elevated to each internal section, where at least a portion of the vapor in the mixed fluid is extracted and the remaining mixed fluid is either distributed to the next cooling region or exit the cooling device. The cooling system includes at least one such cooling device, a fluid loop for recirculating liquid in the mixed fluid in the loop, and a vapor loop for recirculating vapor in the mixed fluid exiting the cooling device.

19 Claims, 8 Drawing Sheets

(56) References Cited

U.S. PATENT DOCUMENTS

| | | | | |
|---|---|---|---|---|
| 7,403,393 B2* | 7/2008 | Herring | | H01L 23/4332 |
| | | | | 257/E23.091 |
| 7,508,669 B2* | 3/2009 | Fonfara | | H01L 23/473 |
| | | | | 361/698 |
| 7,511,957 B2* | 3/2009 | Campbell | | H01L 23/4735 |
| | | | | 257/714 |
| 7,597,134 B2* | 10/2009 | Min | | H01L 23/4006 |
| | | | | 165/104.33 |
| 7,753,109 B2* | 7/2010 | Min | | F28D 15/0266 |
| | | | | 165/104.33 |
| 7,755,186 B2* | 7/2010 | Chiu | | H01L 23/3675 |
| | | | | 257/714 |
| 7,965,511 B2* | 6/2011 | Refai-Ahmed | | F28D 15/0275 |
| | | | | 174/15.1 |
| 7,983,043 B2* | 7/2011 | Xu | | F28D 15/0233 |
| | | | | 361/679.52 |
| 8,014,150 B2* | 9/2011 | Campbell | | H05K 7/20809 |
| | | | | 165/185 |
| 8,021,023 B2* | 9/2011 | Liu | | F21V 29/67 |
| | | | | 362/264 |
| 8,286,693 B2* | 10/2012 | Whitney | | B21D 53/02 |
| | | | | 165/104.21 |
| 8,459,335 B2* | 6/2013 | Lin | | H01L 23/467 |
| | | | | 165/104.33 |
| 8,934,235 B2* | 1/2015 | Rubenstein | | F28D 15/0275 |
| | | | | 361/679.48 |
| 9,606,586 B2* | 3/2017 | Rubenstein | | H01L 23/427 |
| 10,912,229 B1* | 2/2021 | Gao | | H05K 7/20745 |
| 10,916,818 B2* | 2/2021 | Gao | | H05K 7/20309 |
| 2001/0030039 A1* | 10/2001 | Copeland | | F28F 3/048 |
| | | | | 165/185 |
| 2005/0094375 A1* | 5/2005 | Chiang | | F28D 15/0275 |
| | | | | 257/E23.099 |
| 2005/0098304 A1* | 5/2005 | Lin | | F28D 15/0275 |
| | | | | 165/104.33 |
| 2005/0128710 A1* | 6/2005 | Beitelmal | | H05K 7/20445 |
| | | | | 361/709 |
| 2006/0109628 A1* | 5/2006 | Searby | | H01L 23/467 |
| | | | | 257/E23.099 |
| 2007/0025085 A1* | 2/2007 | Chang | | F28D 15/0233 |
| | | | | 361/704 |
| 2007/0217162 A1* | 9/2007 | Zhou | | H01L 23/4006 |
| | | | | 257/E23.084 |
| 2008/0078528 A1* | 4/2008 | Lai | | F28D 15/0275 |
| | | | | 257/E23.099 |
| 2009/0151898 A1* | 6/2009 | Lai | | F28D 15/0233 |
| | | | | 165/80.3 |
| 2009/0154102 A1* | 6/2009 | Zhou | | H01L 23/467 |
| | | | | 361/709 |
| 2012/0012281 A1* | 1/2012 | Franz | | G06F 1/20 |
| | | | | 165/104.21 |
| 2012/0067550 A1* | 3/2012 | Shih | | H01L 23/427 |
| | | | | 165/104.21 |
| 2015/0062819 A1* | 3/2015 | Oughton, Jr. | | H05K 7/20336 |
| | | | | 361/700 |
| 2020/0350229 A1* | 11/2020 | Chang | | H01L 23/3733 |
| 2022/0346273 A1* | 10/2022 | Chen | | G06F 1/182 |
| 2023/0345669 A1* | 10/2023 | Chen | | H05K 7/20254 |

\* cited by examiner

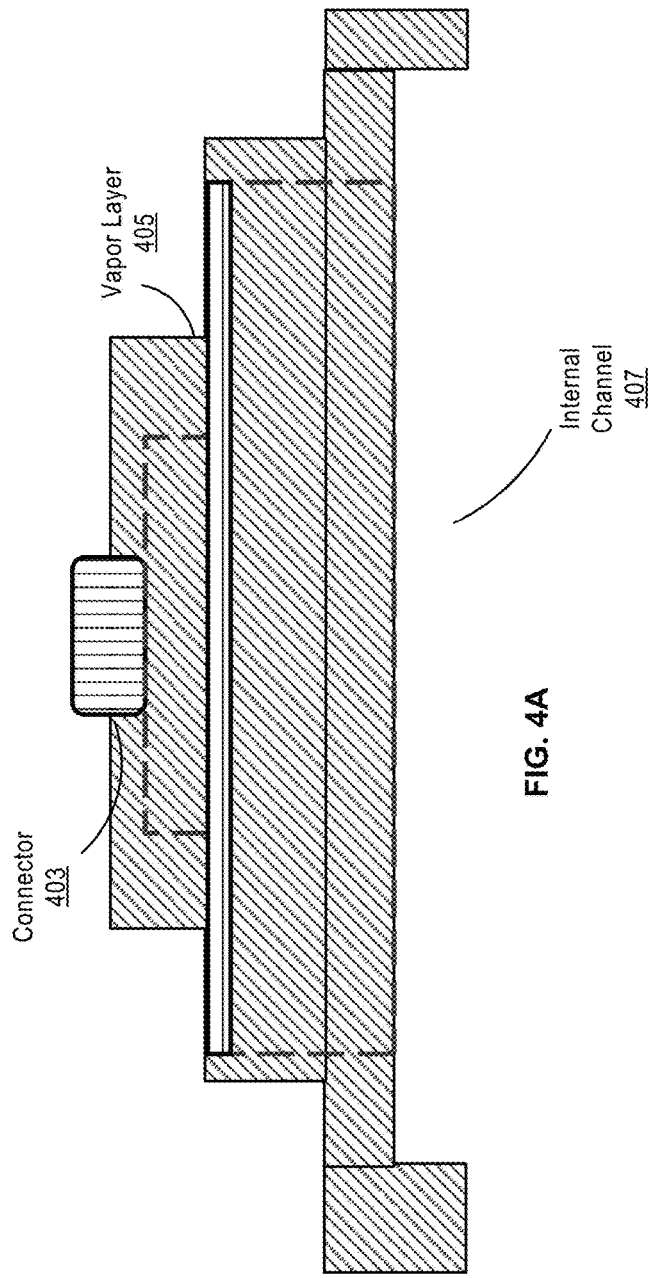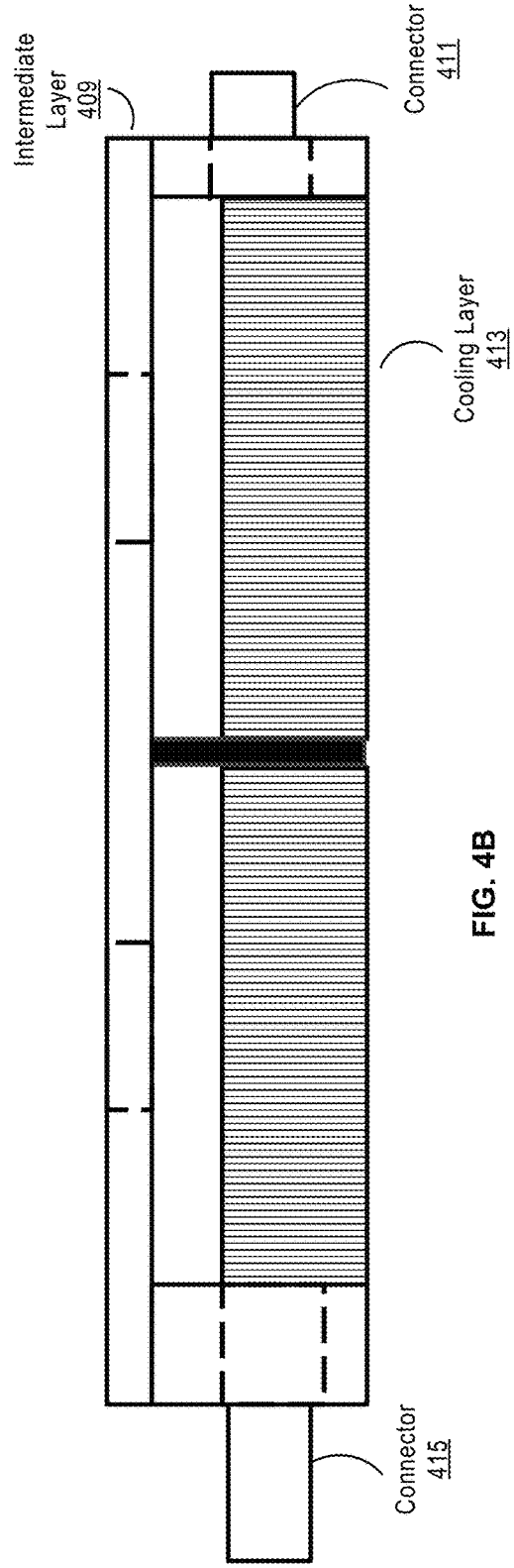

THERMAL MANAGEMENT DEVICE FOR HIGH DENSITY PROCESSING UNIT

FIELD OF THE INVENTION

Embodiments of the present disclosure relate generally to cooling systems. More particularly, embodiments of the disclosure relate to a thermal management device for a high density processing unit, such as a computer chip.

BACKGROUND

An efficient thermal management solution requires a hardware design that is flexible enough to accommodate the ever changing IT requirements. With the dynamic changes on the semiconductor and chip technologies, as well as the increasing computing capability for different AI workloads, the power density of these chips has increased dramatically. This results in major challenges to thermal designs for cooling devices for serves and racks.

However, existing solutions for single phase immersion system only consider rack level fluid recirculation without any local cooling acceleration. In addition, current immersion cooling solutions, either single-phase or two-phase, do not sufficiently support high-power density servers, which include one or more high-power density chips. Further, the existing solutions may not be used directly across different cooling systems.

BRIEF DESCRIPTION OF THE DRAWINGS

Embodiments of the invention are illustrated by way of example and not limitation in the figures of the accompanying drawings in which like references indicate similar elements.

FIGS. 4A and 4B illustrate key components for assembling the cooling device for thermal management according to one embodiment of the invention.

DETAILED DESCRIPTION

Figure 1:
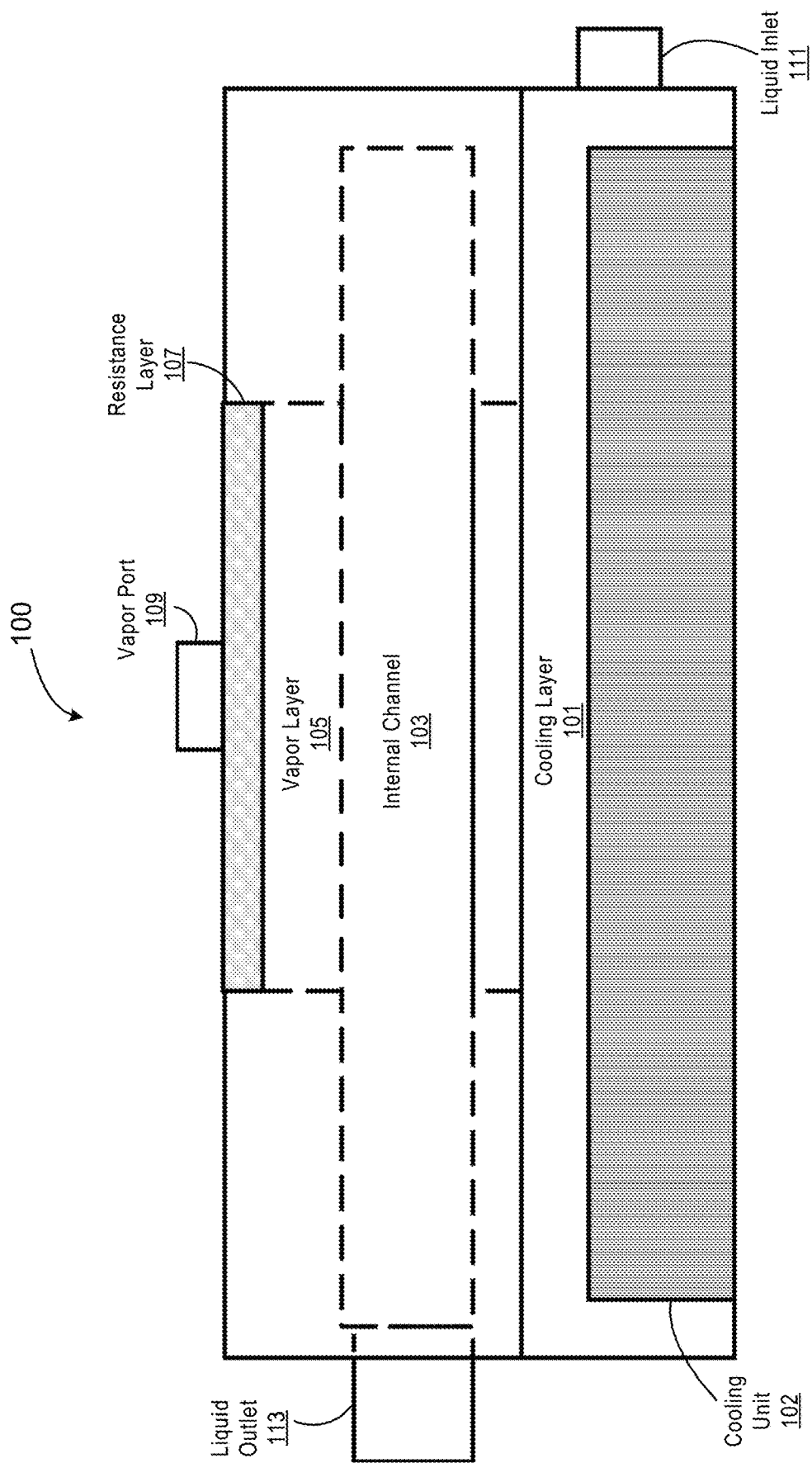
FIG. 1 shows a cooling device according to an embodiment of the invention.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

According to various embodiments, the disclosure describes a hardware package that provides high-performance thermal management cooling device (hereinafter cooling device) for high density chips, each of which can include multiple dies with different power densities. The hardware package is designed in such a way that it can be used to efficiently cool different systems, and can efficiently accommodate the cooling requirements for constantly increasing power densities of the chips. The cooling unit can be used in either a two-phase liquid cooling system or a one-phase liquid cooling system. Multiple such high-performance thermal management cooling devices can be integrated into a cooling system.

In an embodiment, a cooling device includes a cooling layer, an internal channel, and a vapor layer. The cooling layer includes a cooling unit which can be a cooling fins unit, which can be one of many different structures (e.g., cooling fins) for forming fluid flow paths.

The cooling layer can be divided into two or more cooling regions (e.g., cooling compartments) that can be are connected through the internal channel. The cooling layer can be connected with a liquid inlet port, through which two-phase coolant can enter the cooling layer for extracting heat from one or more chips that are attached to the cooling layer. The two-phase coolant is then converted into mixed fluid due to the heat extracted from the chip. The mixed liquid can be transported through the internal channel and the vapor layer. Within the internal channel and the vapor layer, the vapor portion of the mixed liquid can be at least partially extracted from the mixed fluid. The extracted vapor can exit the cooling device via a vapor port on the top of the cooling device. The liquid portion of the mixed liquid is then dragged out of the cooling device via a liquid outlet.

In an embodiment, before being dragged out the cooling device, the liquid portion of the mixed fluid can be the dragged to a compartment close to the liquid outlet. A pump disposed at the side of the liquid outlet pulling the fluid passing through the cooling device.

In one embodiment, the vapor layer can include a resistance layer disposed between the vapor layer and the vapor port to assist in the extraction of the vapor from the mixed fluid. The resistance layer includes multi-layered micro openings to block liquid in the mixed fluid in the internal channel from entering the vapor layer.

In one embodiment, the first cooling region and the second cooling region in the cooling layer are created by a first divider, wherein the first divider blocks the two-phase coolant and the mixed fluid in the first cooling region from directly entering the second cooling region, and vice versa.

In one embodiment, the mixed fluid with the at least portion of vapor extracted is heated again by the chip in the second cooling region, and the reheated mixed fluid is elevated to the internal channel again.

In one embodiment, the cooling layer further includes a third cooling region. The second cooling region and the third cooling region are created by a second divider. The second divider blocks two phase coolant and mixed fluid in each cooling region from directly entering another cooling region. The reheated mixed fluid elevated from the second cooling region has at least a portion of its vapor extracted, and then is distributed to the third cooling region for cooling the chip. The mixed fluid in the third cooling area is reheated by the chip, and then exits the cooling device via the liquid outlet connected to the cooling layer. Alternatively, the mixed fluid in the third cooling areas is reheated by the chip and then elevated to the internal channel, and at least a portion of vapor is extracted from the reheated mixed fluid and then elevated to the vapor layer.

In one embodiment, each of the first cooling, the second cooling region, and the third cooling region is to cool a separate region on the chip, and corresponds to a separate section of the internal channel. The pump connected to the liquid outlet operates to create regions with different pressures in each section of the internal structure to facilitate vapor extraction from the mixed fluid in the section, and to drag the mixed liquid in the section towards the liquid outlet.

In one embodiment, a cooling system includes one or more cooling devices, and a condenser disposed above the one or more cooling devices. Each cooling device includes a cooling layer attached to a chip and including a first cooling region and a second cooling region. The cooling device further includes an internal channel positioned on top of the cooling layer, and a vapor layer positioned on top of the internal channel. The first cooling region generates mixed fluid from two phase coolant due to heat extracted from the chip. The internal channel and the vapor layer manage to extract at least a portion of vapor from the mixed fluid. The mixed fluid with the at least portion of vapor extracted is distributed to the second cooling region. The at least portion of the vapor is elevated out of a vapor port to the condenser, which condenses the at least portion of vapor to liquid and distributes the liquid back to the cooling device via a liquid inlet on the cooling device.

In one embodiment, the cooling device includes multiple cooling regions in the cooling layer, and each cooling region has a corresponding section in the internal channel.

In one embodiment, mixed fluid exiting the cooling device includes vapor and liquid. The liquid is recirculated back to the liquid inlet, whereas the vapor is elevated to the condenser, which condenses the vapor to liquid and returns the liquid to the liquid inlet.

The various embodiments described above can provide an efficient heat extracting design, a non-uniform power mapping on a single chip or a device, and an efficient fluid management solution. They can solve hot spot issues on chips, and accommodate cooling requirements for different server hardware and electronics components as well as different cooling systems.

The above summary does not include an exhaustive list of all embodiments in this disclosure. All apparatuses in this disclosure can be practiced from all suitable combinations of the various aspects and embodiments described in the disclosure.

FIG. 1 shows a cooling device 100 according to an embodiment of the invention. The cooling device 100 includes a cooling layer 101, an internal channel 103, a vapor layer 105, and a resistance layer 107.

The cooling layer 101 is disposed at the bottom of the cooling device 100, which can be in close contact with a chip to extract heat from the chip. In one embodiment, the cooling layer 101 can include a cooling unit 102, a liquid inlet 111, and a liquid outlet 113. Through the liquid inlet 111, coolant, either single-phase or two-phase, can enter the cooling layer 101 from an external source (e.g., a liquid outlet of a rack), and can be distributed through the cooling unit 102, which can be one of many different structures (e.g., cooling fins) for forming fluid flow paths.

The internal channel 103 can be a container made of various kinds of materials, such as copper, and can be filled with mixed fluid generated by the cooling layer 101 in a two-phase operation. The internal channel 103 can have a large volume, where pressures in in different regions in the internal channel 103 can be regulated to facilitate the extraction of vapor from the mixed liquid.

The vapor layer 105 allows the vapor to be accumulated and extracted from the mixed fluid, and the resistance layer 107 disposed between the vapor layer 105 and the vapor port prevents the liquid phase from flowing to the vapor port 109 to ensure that the major liquid flow to the liquid outlet 109. The resistance layer 105 allows the vapor to pass through easily. In one embodiment, the vapor accumulated in the vapor layer 105 may still contain some liquid.

Thus, to further separate the liquid from the vapor, the resistance layer 107 disposed between the vapor layer 105 and the vapor port 109 can provide resistance to liquid. The resistance layer 107 can be implemented using different materials and structures. For example, the resistance layer 107 can be a multi-layered perforated plate with staggered micro openings, which only allow pure vapor in the vapor layer 105 to pass through the resistance layer to the vapor port 109, while liquid in the vapor layer 105 is blocked.

The liquid outlet 113 can be connected to the internal channel 103 on one side, and to an active fluid mover (e.g., a pump) on the other side. The active fluid mover can operate to pull the remaining portion (mostly liquid) of the mixed fluid out of the internal channel 103 via the liquid outlet 113.

Figure 2:
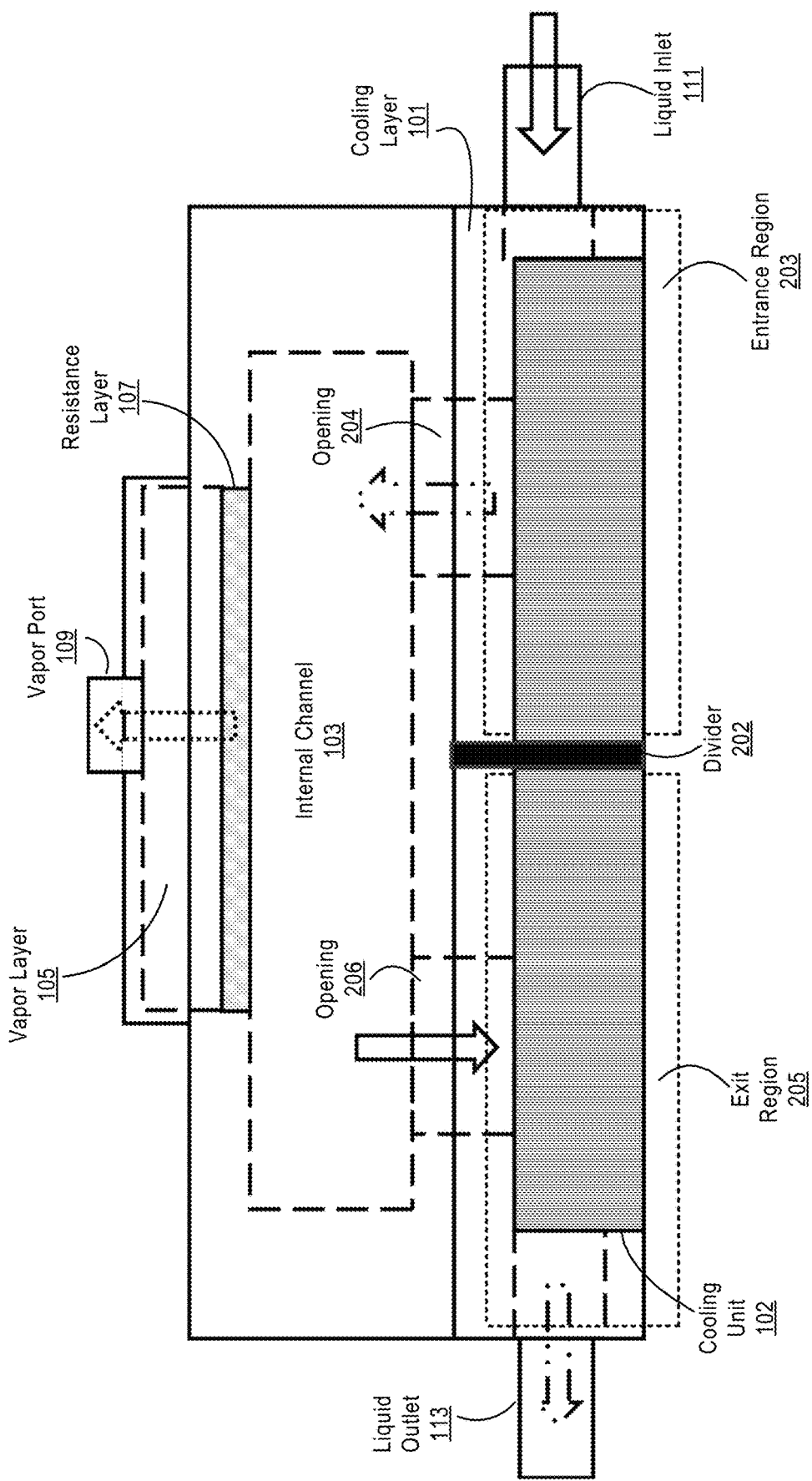
FIG. 2 shows a modified design of the cooing device according to an embodiment of the invention.

FIG. 2 shows a modified design of the cooing device 100 according to an embodiment of the invention. As shown in the figure, in this embodiment, the cooling layer 101 can be divided into an entrance region 203 and an exit region 205 by a divider 202. Further, in this embodiment, the liquid outlet 113 is connected to the cooling layer 101, instead of being connected to the internal channel 103 as in FIG. 1.

The two cooling regions 203 and 205 are completely separate regions except that both regions 203 and 205 are connected to the same internal channel 103 on the top. The divider 202 can be a metal plate made of various materials (e.g. copper) designed to block liquid, vapor, and/or mixed liquid in the entrance region 203 from entering the exit region 205, and vice versa.

In one embodiment, each of the entrance region 203 and the exit region 205 can be attached to a different portion of a chip to satisfy the different power densities of the different portions.

When two-phase coolant enters the cooling layer 101 via the liquid inlet 111, the two-phase coolant can be distributed in the portion of the cooling unit 102 in the entrance region 203. Due to heat extracted from the corresponding portion of the chip, the two-phase coolant can be converted into mixed liquid, which is a mix of liquid and vapor. The mixed fluid can be elevated to the internal channel 103 via an opening 204 due to the lower density of the mixed fluid. At least part of the vapor in the mixed fluid can be further elevated to the vapor layer 105 after passing through the resistance layer 107.

In one embodiment, the liquid portion (also including a small portion of vapor) can be distributed to the exit region 205 via an opening 206 due to a combination effect of gravity and the active fluid mover connected to the liquid outlet 113.

In the exit region 205, the liquid portion from the internal channel 103 can be converted to mixed fluid due to heat extracted from the corresponding portion of the chip. The mixed fluid in the exit region 205 can be pulled out of the cooling layer 101 via the liquid outlet 113. Since the liquid portion also includes some vapor, the liquid portion can be considered mixed fluid. The liquid portion being reheated can be considered as the mixed fluid being reheated, and can continuing extracting heat.

Figure 3:
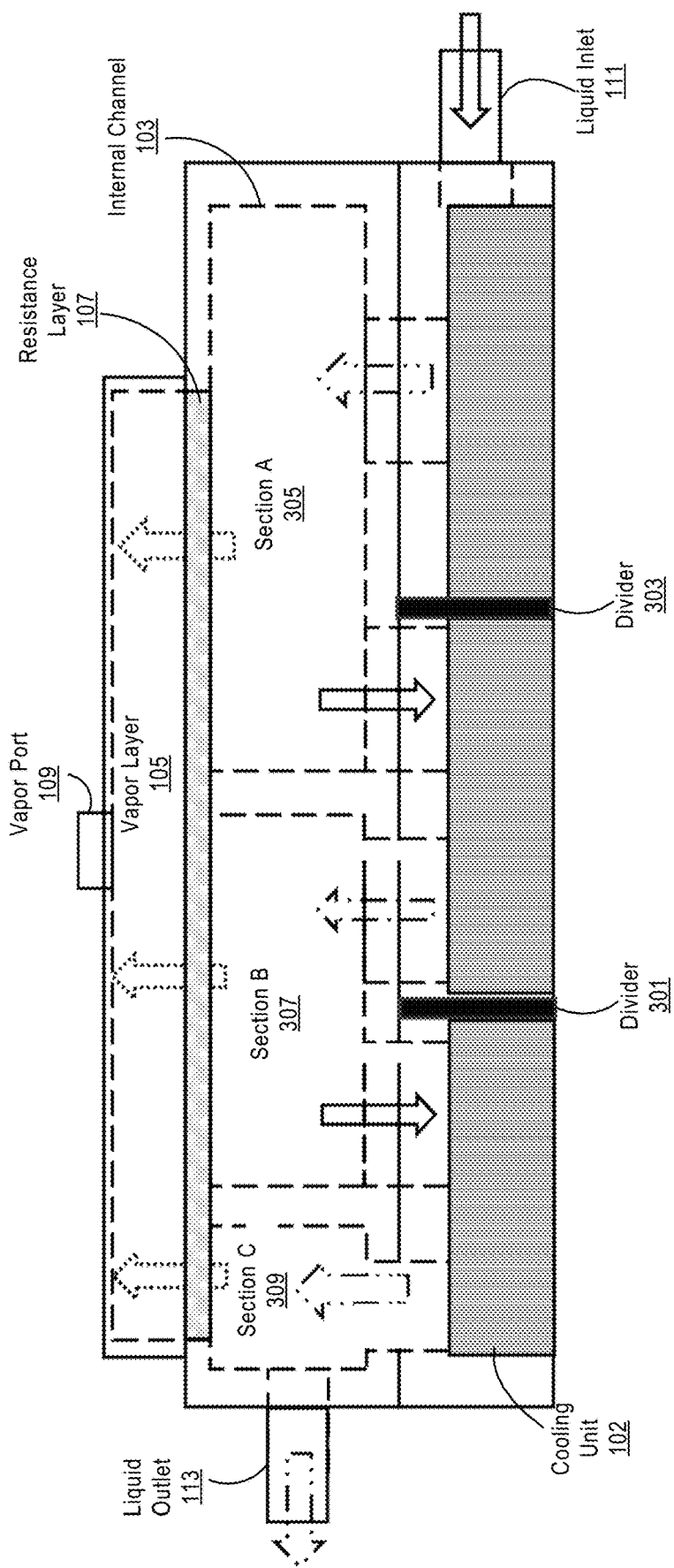
FIG. 3 shows another design of the cooling device according to an embodiment of the invention.

FIG. 3 shows another design of the cooling device 100 according to an embodiment of the invention. The design illustrated in this embodiment is a more comprehensive design, where the cooling unit 102 is divided into three different cooling regions by dividers 301 and 303. The different cooling regions can have different customized internal structures based on power density maps of the different portions of a chip attached to the cooling device 100.

In one embodiment, the internal channel 103 is also separated into three sections 305, 307 and 309. Each section can contain mixed fluid generated by the corresponding cooling region in the cooling layer 101.

The embodiment in FIG. 3 is similar to the embodiment described in FIG. 2, except that each of the cooling layer 101 and the internal structure 103 is divided into three regions, and that the liquid outlet 113 can be connected to either the cooling layer 101 or the internal channel layer 103.

The embodiment in FIG. 3 is provided for the purpose of illustration. In actual implementations, both the cooling layer 101 and the internal channel 103 can be divided into as many regions as needed based on the size of the chip to be cooled. In some embodiments, each of the regions can be used to cool a different chip in an electronic device.

FIGS. 4A and 4B illustrate key components for assembling the cooling device 100 according to one embodiment of the invention. These key components include a top portion as shown in FIG. 4A, and a bottom portion as shown in FIG. 4B.

The top portion includes a connector 403 (i.e., port) for discharging vapor, a vapor layer 405, and an internal channel portion 407. A resistance layer 404 can be added in the top portion. The top portion can be understood as a combination of the vapor layer and the internal channel 407. The resistance layer 404 can be either a separate unit added to the location shown in FIG. 4A or preassembled with either the vapor layer 405 or the internal channel 407.

The bottom portion in FIG. 4B can include a cooling layer 413, an intermediate layer 409, and two connectors 411 and 415 that function respectively as a liquid inlet and a liquid outlet. The intermediate layer 409 can be used as a communication channel between the cooling layer 413 and the internal channel 407.

Figure 5:
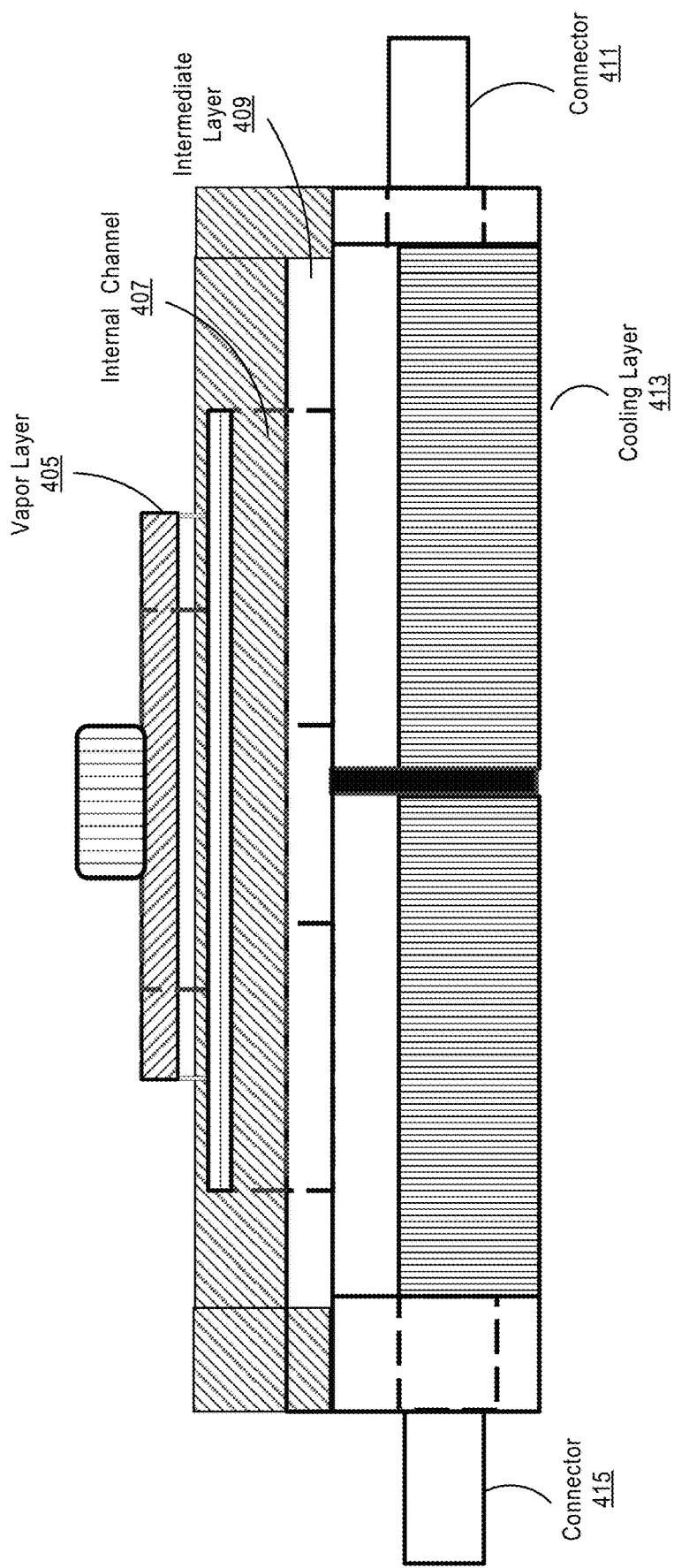
FIG. 5 shows a cooling device that has been assembled according to an embodiment of the invention.

FIG. 5 shows a cooling device 100 that has been assembled according to an embodiment of the invention. The complete cooling device 100 includes two cooling regions in the cooling layer 413.

Figure 6:
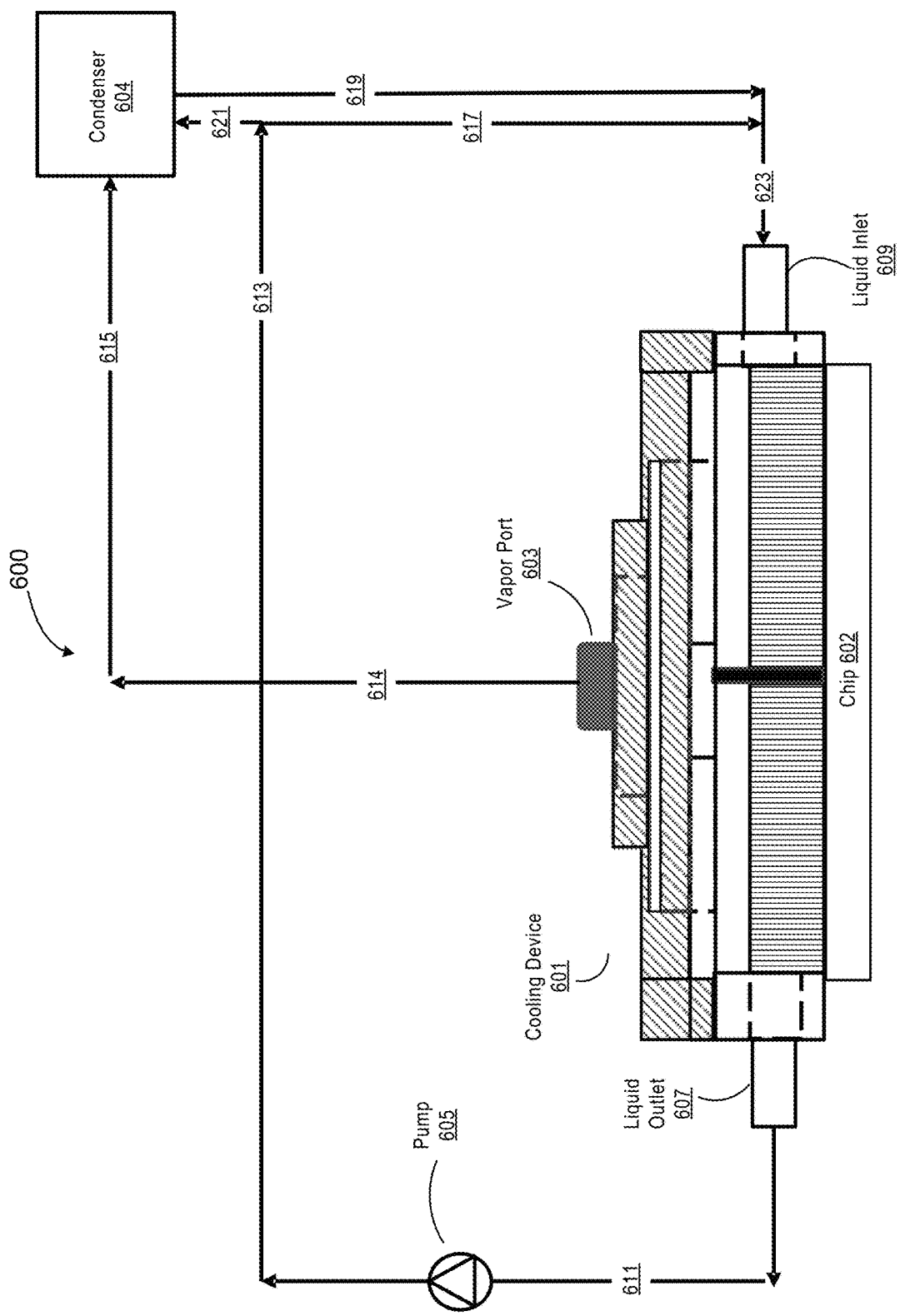
FIG. 6 shows a cooling system using the cooling device in an embodiment of the invention.

FIG. 6 shows a cooling system 600 using the cooling device 100 in an embodiment of the invention. The cooling system 600 is a two-phase fluid cooling system that can be used to cool a chip 602 attached to a cooling device 601. The cooling device 601 can be a cooling device 100 described in FIGS. 1-3. A vapor port 603 of the cooling device 601 can be connected to a dedicated loop comprising pipe segments 614, 615, 619, and 623 as well as a condenser 604. Vapor exiting the vapor port 603 from the cooling device 601 can be elevated to the condenser 604 via the pipe segments 614 and 615. The condenser 604 can condense the vapor into liquid, which is distributed to a liquid inlet 609 of the cooling device 601 via the pipe segment 619. The pipe segment 619 may also be designed with gravity features in an embodiment.

The liquid outlet 607 of the cooling device 601 can be connected to an active pump 605. Mixed fluid coming out of the liquid outlet 607 primarily comprises of liquid with some vapor. As described above, the cooling device 601 cannot extract 100% of the vapor from the mixed fluid.

In one embodiment, the vapor portion (mixed fluid) of the mixed fluid from the liquid out 607 can be elevated to the condenser 604 via pipe segments 611 and 613. The pure vapor (ideally) of the vapor portion of the mixed fluid can be merged with the pure vapor (ideally) from the vapor port 603, and can be elevated to the condenser 604 via a pipe segment 621. The liquid portion of the mixed fluid coming of the liquid outlet 607 can be distributed back to the liquid inlet 609 due to gravity via pipe segment 617 and 623, and can be merged with the condensed liquid from the condenser 604.

Figure 7:
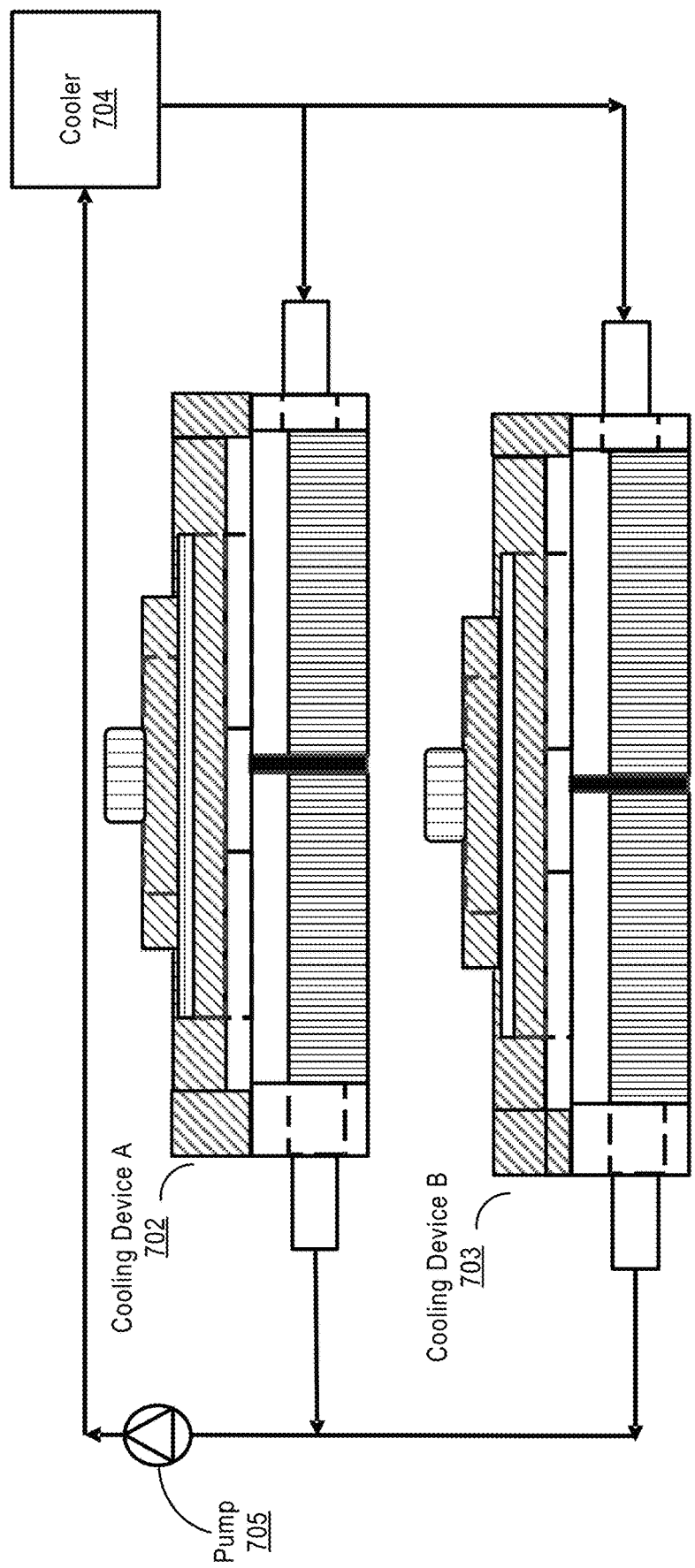
FIG. 7 shows a cooling system using multiple cooling devices for running with single-phase coolant in an embodiment of the invention.

FIG. 7 shows a cooling system using multiple cooling devices for running with single-phase coolant in an embodiment of the invention. In this embodiment, two single-phase cooling devices 702 and 703 are used in parallel, and the vapor port on each of the single-phase cooling devices 702 and 703 is disabled. This embodiment can provide high compatibility across cooling systems that use different cooling technologies.

As shown, a cooler 704 is used instead of a condenser as in FIG. 6 because no vapor is elevated from the cooling devices 702 and 703. The single-phase cooling liquid in the cooling system is recirculated among the cooling devices and the cooler 704, which means the cooler 704, the cooling device 702, and the cooling device 703 can share coolant from one another.

Figure 8:
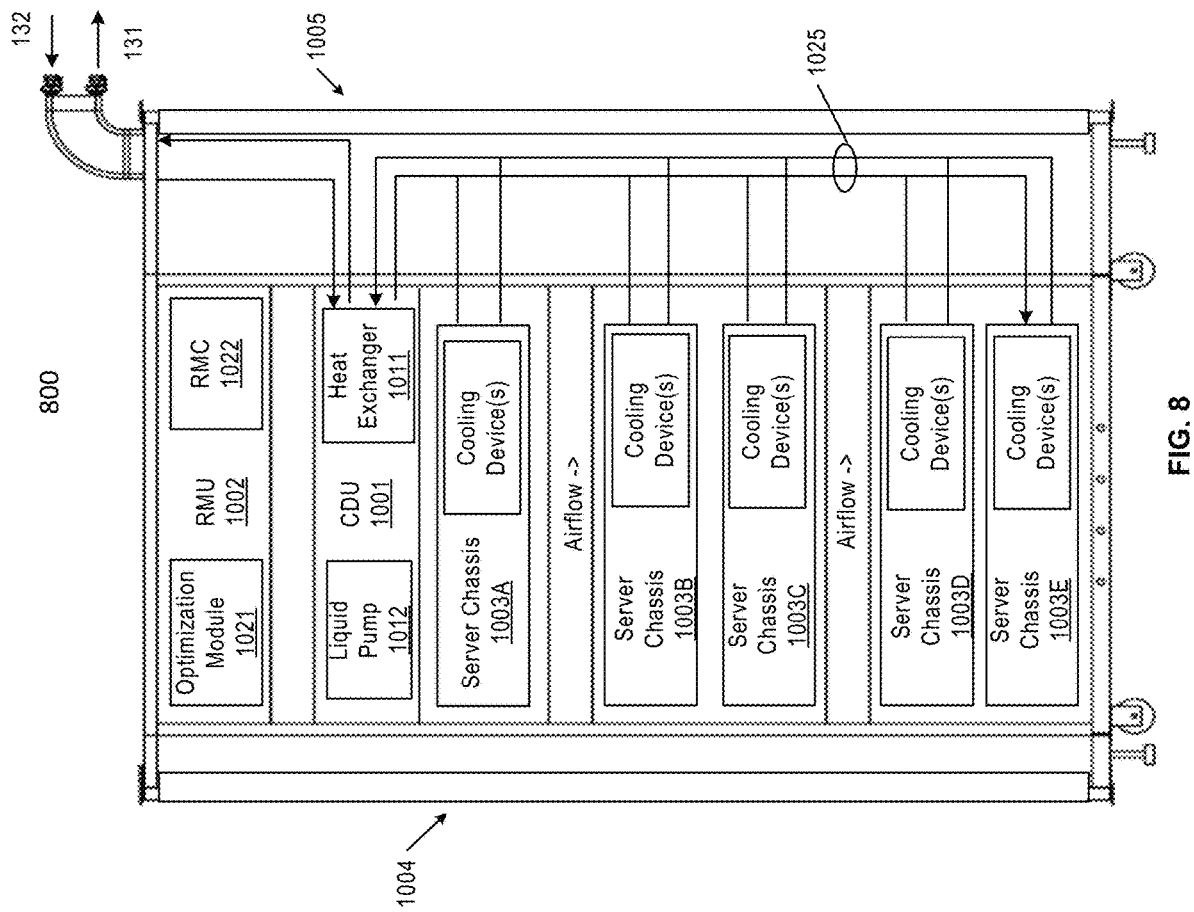
FIG. 8 is block diagram illustrating an electronic rack according to one embodiment.

FIG. 8 is block diagram illustrating an electronic rack according to one embodiment. Electronic rack 800 may represent any of the electronic racks of a data center. Referring to FIG. 8, according to one embodiment, electronic rack 800 includes, but is not limited to, CDU 1001, rack management unit (RMU) 1002, and one or more server chassis 1003A-1003E (collectively referred to as server chassis 1003). Server chassis 1003 can be inserted into an array of server slots (e.g., standard shelves) respectively from frontend 1004 or backend 1005 of electronic rack 800. Note that although there are five server chassis 1003A-1003E shown here, more or fewer server chassis may be maintained within electronic rack 800. Also note that the particular positions of CDU 1001, RMU 1002, and/or server chassis 1003 are shown for the purpose of illustration only; other arrangements or configurations of CDU 1001, RMU 1002, and/or server chassis 1003 may also be implemented. In one embodiment, electronic rack 800 can be either open to the environment or partially contained by a rack container, as long as the cooling fans can generate airflows from the frontend to the backend.

In many modern racks, the 1025 are directly extended to the external to 132 and 131 without CDU 1001. In addition, for at least some of the server chassis 1003, an optional fan module (not shown) is associated with the server chassis. Each of the fan modules includes one or more cooling fans. The fan modules may be mounted on the backends of server chassis 1003 or on the electronic rack to generate airflows flowing from frontend 1004, traveling through the air space of the sever chassis 1003, and existing at backend 1005 of electronic rack 800.

In one embodiment, CDU 1001 mainly includes heat exchanger 1011, liquid pump 1012, and a pump controller (not shown), and some other components such as a liquid reservoir, a power supply, monitoring sensors and so on. Heat exchanger 1011 may be a liquid-to-liquid heat exchanger. Heat exchanger 1011 includes a first loop with inlet and outlet ports having a first pair of liquid connectors coupled to external liquid supply/return lines 131-132 to form a primary loop. The connectors coupled to the external liquid supply/return lines 131-132 may be disposed or mounted on backend 1005 of electronic rack 800. The liquid supply/return lines 131-132, also referred to as room liquid supply/return lines, may be coupled to an external cooling system (e.g., a data center room cooling system).

In addition, heat exchanger 1011 further includes a second loop with two ports having a second pair of liquid connectors coupled to liquid manifold 1025 (also referred to as a rack manifold) to form a secondary loop, which may include a supply manifold (also referred to as a rack liquid supply line or rack supply manifold) to supply cooling liquid to server chassis 1003 and a return manifold (also referred to as a rack liquid return line or rack return manifold) to return warmer liquid back to CDU 1001. Note that CDUs 1001 can be any kind of CDUs commercially available or customized ones. Thus, the details of CDUs 1001 will not be described herein.

Each of server chassis 1003 may include one or more IT components (e.g., central processing units or CPUs, general/graphic processing units (GPUs), memory, and/or storage devices). Each IT component may perform data processing tasks, where the IT component may include software installed in a storage device, loaded into the memory, and executed by one or more processors to perform the data processing tasks. Server chassis 1003 may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the computing nodes or compute servers (having one or more GPUs) managed by the host server. The compute servers perform the actual tasks, which may generate heat during the operations.

Electronic rack 800 further includes optional RMU 1002 configured to provide and manage power supplied to servers 1003, and CDU 1001. RMU 1002 may be coupled to a power supply unit (not shown) to manage the power consumption of the power supply unit. The power supply unit may include the necessary circuitry (e.g., an alternating current (AC) to direct current (DC) or DC to DC power converter, battery, transformer, or regulator, etc.,) to provide power to the rest of the components of electronic rack 800.

In one embodiment, RMU 1002 includes optimization module 1021 and rack management controller (RMC) 1022. RMC 1022 may include a monitor to monitor operating status of various components within electronic rack 800, such as, for example, computing nodes 1003, CDU 1001, and the fan modules. Specifically, the monitor receives operating data from various sensors representing the operating environments of electronic rack 800. For example, the monitor may receive operating data representing temperatures of the processors, cooling liquid, and airflows, which may be captured and collected via various temperature sensors. The monitor may also receive data representing the fan power and pump power generated by the fan modules and liquid pump 1012, which may be proportional to their respective speeds. These operating data are referred to as real-time operating data. Note that the monitor may be implemented as a separate module within RMU 1002.

Based on the operating data, optimization module 1021 performs an optimization using a predetermined optimization function or optimization model to derive a set of optimal fan speeds for the fan modules and an optimal pump speed for liquid pump 1012, such that the total power consumption of liquid pump 1012 and the fan modules reaches minimum, while the operating data associated with liquid pump 1012 and cooling fans of the fan modules are within their respective designed specifications. Once the optimal pump speed and optimal fan speeds have been determined, RMC 1022 configures liquid pump 1012 and cooling fans of the fan modules based on the optimal pump speeds and fan speeds.

As an example, based on the optimal pump speed, RMC 1022 communicates with a pump controller of CDU 1001 to control the speed of liquid pump 1012, which in turn controls a liquid flow rate of cooling liquid supplied to the liquid manifold 1025 to be distributed to at least some of server chassis 1003. Similarly, based on the optimal fan speeds, RMC 1022 communicates with each of the fan modules to control the speed of each cooling fan of the fan modules, which in turn control the airflow rates of the fan modules. Note that each of fan modules may be individually controlled with its specific optimal fan speed, and different fan modules and/or different cooling fans within the same fan module may have different optimal fan speeds.

Note that the rack configuration as shown in FIG. 8 is shown and described for the purpose of illustration only; other configurations or arrangements may also be applicable. For example, CDU 1001 may be an optional unit. The cold plates of server chassis 1003 may be coupled to a rack manifold, which may be directly coupled to room manifolds 131-132 without using a CDU. Although not shown, a power supply unit may be disposed within electronic rack 800. The power supply unit may be implemented as a standard chassis identical or similar to a sever chassis, where the power supply chassis can be inserted into any of the standard shelves, replacing any of server chassis 1003. In addition, the power supply chassis may further include a battery backup unit (BBU) to provide battery power to server chassis 1003 when the main power is unavailable. The BBU may include one or more battery packages and each battery package include one or more battery cells, as well as the necessary charging and discharging circuits for charging and discharging the battery cells.

In one embodiment, the cooling devices disposed in each of the server chassis as shown may represent any cooling device described throughout this application.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

As previously explained, an embodiment of the disclosure may be (or include) a non-transitory machine-readable medium (such as microelectronic memory) having stored thereon instructions, which program one or more data processing components (generically referred to here as a "processor") to perform airflow management operations, such as controlling fan speed of one or more fans of the battery module (and/or BBU shelf). In other embodiments, some of these operations might be performed by specific hardware components that contain hardwired logic. Those operations might alternatively be performed by any combination of programmed data processing components and fixed hardwired circuit components of any of the battery modules described herein.

While certain aspects have been described and shown in the accompanying drawings, it is to be understood that such aspects are merely illustrative of and not restrictive on the broad disclosure, and that the disclosure is not limited to the specific constructions and arrangements shown and described, since various other modifications may occur to those of ordinary skill in the art. The description is thus to be regarded as illustrative instead of limiting.

In some aspects, this disclosure may include the language, for example, "at least one of [element A] and [element B]." This language may refer to one or more of the elements. For example, "at least one of A and B" may refer to "A," "B," or "A and B." Specifically, "at least one of A and B" may refer to "at least one of A and at least one of B," or "at least of either A or B." In some aspects, this disclosure may include the language, for example, "[element A], [element B], and/or [element C]." This language may refer to either of the elements or any combination thereof. For instance, "A, B, and/or C" may refer to "A," "B," "C," "A and B," "A and C," "B and C," or "A, B, and C."

What is claimed is:

1. A cooling device for cooling a chip in an electronic device, comprising:
    a cooling layer attached to the chip and including a first cooling region and a second cooling region;
    an internal channel coupled to the cooling layer; and
    a vapor layer coupled to the internal channel,
    wherein the vapor layer, the internal channel, and the cooling layer are stacked upon each other,
    wherein the first cooling region generates mixed fluid from two phase coolant due to heat extracted from the chip,
    wherein the internal channel and the vapor layer manage to extract at least a portion of vapor from the mixed fluid, and
    wherein the mixed fluid with the at least portion of vapor extracted is distributed to the second cooling region.

2. The cooling device of claim 1, further comprising a resistance layer disposed between the internal channel and the vapor layer, wherein the resistance layer blocks liquid in the mixed fluid in the internal channel from entering the vapor layer.

3. The cooling device of claim 1, wherein the cooling layer includes a cooling unit, a liquid inlet, and a liquid outlet.

4. The cooling device of claim 1, further comprising a vapor port coupled to the vapor layer, wherein the at least portion of vapor extracted from the mixed fluid exits the cooling device from the vapor port.

5. The cooling device of claim 3, wherein the first cooling region and the second cooling region are created by a first divider, wherein the first divider blocks two phase coolant and mixed fluid in each cooling region from directly entering another cooling region.

6. The cooling device of claim 5, wherein the mixed fluid with the at least portion of vapor extracted is heated again in the second cooling region by the chip, wherein the reheated mixed fluid is elevated to the internal channel again.

7. The cooling device of claim 3, wherein the cooling layer further includes a third cooling region, wherein the second cooling region and the third cooling region are created by a second divider, wherein the second divider blocks two phase coolant and mixed fluid in each cooling region from directly entering another cooling region.

8. The cooling device of claim 7, wherein the reheated mixed fluid elevated from the second cooling region has at least a portion of its vapor extracted, and then is distributed to the third cooling region for cooling the chip.

9. The cooling device of claim 8, wherein the mixed fluid in the third cooling region is reheated by the chip, and then exits the cooling device via the liquid outlet connected to the cooling layer.

10. The cooling device of claim 9, wherein the mixed fluid in the third cooling region is reheated by the chip and then elevated to the internal channel, wherein at least a portion of vapor is extracted from the reheated mixed fluid and elevated to the vapor layer.

11. The cooling device of claim 7, wherein each of the first cooling region, the second cooling region, and the third cooling region is to cool a separate region on the chip.

12. The cooling device of claim 7, wherein each of the first cooling region, the second cooling region, and the third cooling region corresponds to a separate section of the internal channel.

13. The cooling device of claim 12, further comprising a pump connected to the liquid outlet.

14. A cooling system, comprising:
    one or more cooling devices; and
    a condenser coupled to the one or more cooling devices, wherein each of the one or more cooling devices includes:
        a cooling layer attached to a chip and including a first cooling region and a second cooling region,
        an internal channel coupled to the cooling layer,
        a vapor layer coupled to the internal channel, the vapor layer being coupled to a vapor port,
        wherein the vapor layer, the internal channel, and the cooling layer are stacked upon each other,
        wherein the first cooling region generates mixed fluid from two phase coolant due to heat extracted from the chip,
        wherein the internal channel and the vapor layer manage to extract at least a portion of vapor from the mixed fluid,
        wherein the mixed fluid with the at least portion of vapor extracted is distributed to the second cooling region, and
        wherein the at least portion of the vapor is elevated out of the vapor port to the condenser, which condenses the at least portion of the vapor to liquid and distribute the liquid back to the cooling device via a liquid inlet.

15. The cooling system of claim 14, wherein the cooling device includes a plurality of cooling regions in the cooling layer, and a plurality of corresponding sections in the internal channel.

16. The cooling system of claim 14, wherein mixed fluid exiting the cooling device includes vapor and liquid, wherein the liquid is recirculated back to the liquid inlet, wherein the vapor is elevated to the condenser.

17. The cooling system of claim 14, wherein the cooling device includes a resistance layer disposed between the internal channel and the vapor layer, wherein the resistance layer blocks liquid in the mixed fluid in the internal channel from entering the vapor layer.

18. The cooling system of claim 14, wherein the cooling layer includes a cooling unit, a liquid inlet, and a liquid outlet.

19. The cooling system of claim 18, wherein the cooling system further includes a pump connected to the liquid outlet.

\* \* \* \* \*